(12) United States Patent
Su et al.

(10) Patent No.: US 12,070,779 B2
(45) Date of Patent: Aug. 27, 2024

(54) METHOD OF MANUFACTURING SEMICONDUCTOR WAFER AND CLEANING SCRUBBER

(71) Applicant: TAIWAN SEMICONDUCTOR MANUFACTURING COMPANY, LTD., Hsinchu (TW)

(72) Inventors: Pei-Yi Su, Taichung (TW); Cheng-Chieh Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 85 days.

(21) Appl. No.: 17/237,182

(22) Filed: Apr. 22, 2021

(65) Prior Publication Data
US 2021/0331211 A1 Oct. 28, 2021

(30) Foreign Application Priority Data
Apr. 23, 2020 (TW) .................. 109113617

(51) Int. Cl.
*B08B 1/10* (2024.01)
*G03F 7/20* (2006.01)

(52) U.S. Cl.
CPC .............. *B08B 1/10* (2024.01); *G03F 7/2004* (2013.01)

(58) Field of Classification Search
None
See application file for complete search history.

(56) References Cited

U.S. PATENT DOCUMENTS

| 10,195,648 | B2 * | 2/2019 | Broz ................ B24B 19/16 |
| 2007/0097346 | A1 * | 5/2007 | Maria Zaal ........ C04B 35/195 |
| | | | 355/75 |
| 2009/0202951 | A1 | 8/2009 | Yamamoto et al. |
| 2010/0258144 | A1 * | 10/2010 | Broz ................ B08B 1/001 |
| | | | 134/115 R |
| 2011/0209728 | A1 | 9/2011 | Sharifi |

FOREIGN PATENT DOCUMENTS

| CN | 1979343 A | 6/2007 | |
| CN | 101506737 A | 8/2009 | |
| CN | 101884016 A | 11/2010 | |
| CN | 102460678 A | 5/2012 | |
| CN | 103688343 A | 3/2014 | |
| CN | 104889083 A | 9/2015 | |
| CN | 113263413 A | 8/2021 | |
| JP | 7-66114 A | 3/1995 | |
| JP | 2009-16422 A | 1/2009 | |
| TW | 1638384 B | 10/2018 | |
| TW | 201916096 A | 4/2019 | |
| TW | M593649 U | 4/2020 | |
| WO | WO-2013083332 A1 * | 6/2013 | ......... G03F 7/70925 |
| WO | WO-2020094388 A1 * | 5/2020 | ............ G03F 7/707 |

* cited by examiner

*Primary Examiner* — Eric W Golightly
*Assistant Examiner* — Arlyn I Rivera-Cordero
(74) *Attorney, Agent, or Firm* — Birch, Stewart, Kolasch & Birch, LLP

(57) ABSTRACT

A method includes performing a cleaning operation on a supporting surface of a wafer table by using a cleaning scrubber having a plurality of microstructures, the plurality of microstructures being spaced apart from each other and having a tapered width; placing a semiconductor wafer on the supporting surface of the wafer table; and performing a photolithography process on the semiconductor wafer.

20 Claims, 12 Drawing Sheets

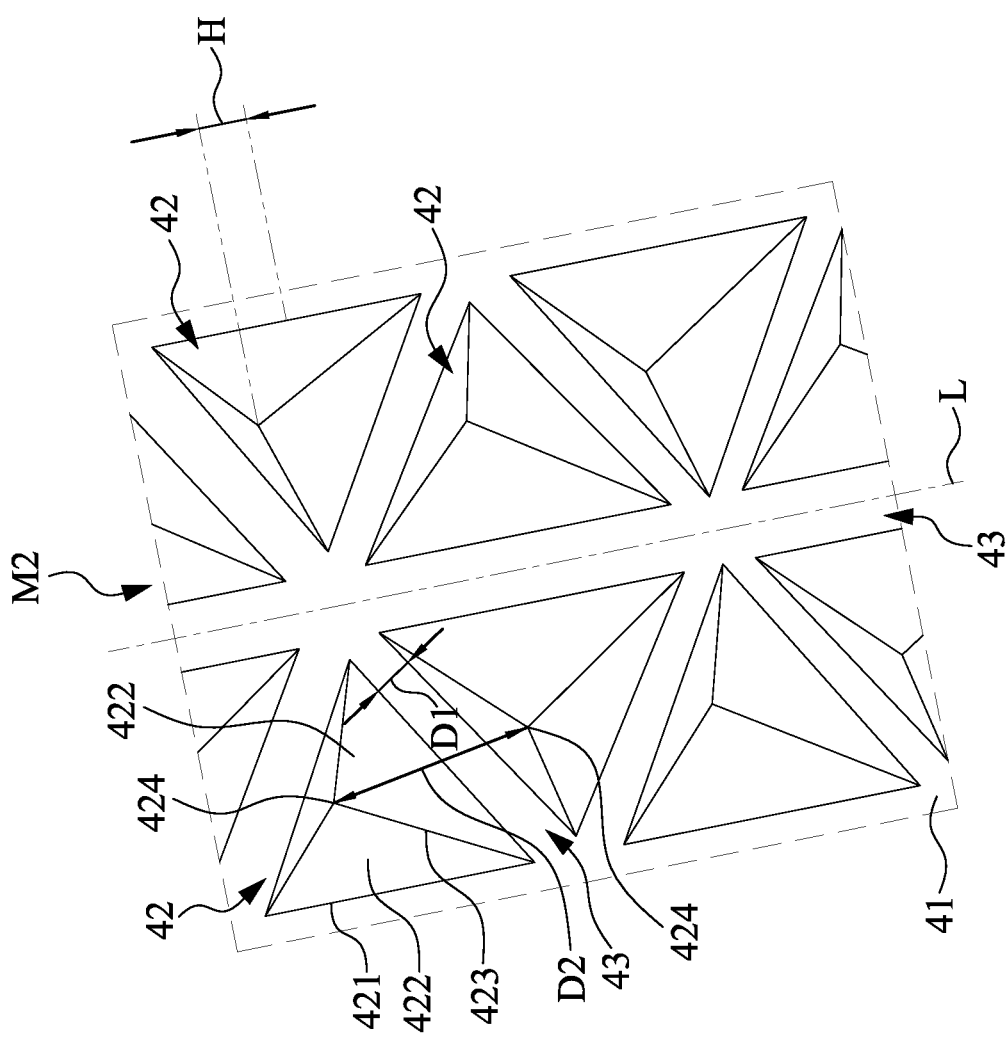
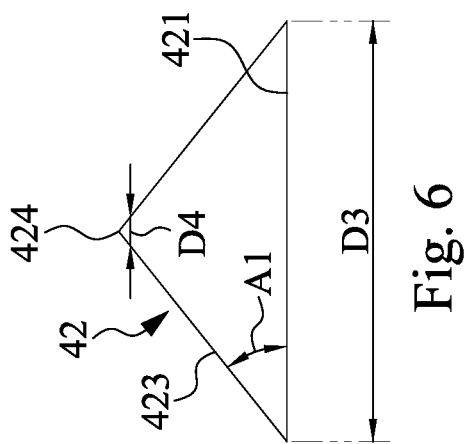
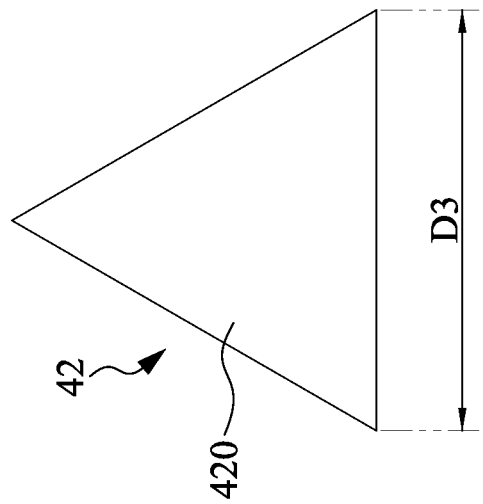
Fig. 5
Fig. 6
Fig. 7

METHOD OF MANUFACTURING SEMICONDUCTOR WAFER AND CLEANING SCRUBBER

PRIORITY CLAIM AND CROSS-REFERENCE

This application claims priority to Taiwan Application Serial Number 109113617, filed Apr. 23, 2020, which is herein incorporated by reference in its entirety.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of IC processing and manufacturing. For these advances to be realized, similar developments in IC processing and manufacturing are needed.

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light having an exposure wavelength of between 10 nm and 130 nm, is a promising next-generation lithography solution for emerging technology nodes, e.g., 32 nm, 22 nm, 14 nm, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a zoomed-in view of a partial region illustrated in FIG. 4.

FIG. 6 is a schematic side view of a microstructure in accordance with some embodiments of the present disclosure.

FIG. 7 is a schematic bottom view of a microstructure in accordance with some embodiments of the present disclosure.

DETAILED DESCRIPTION

Figure 1:
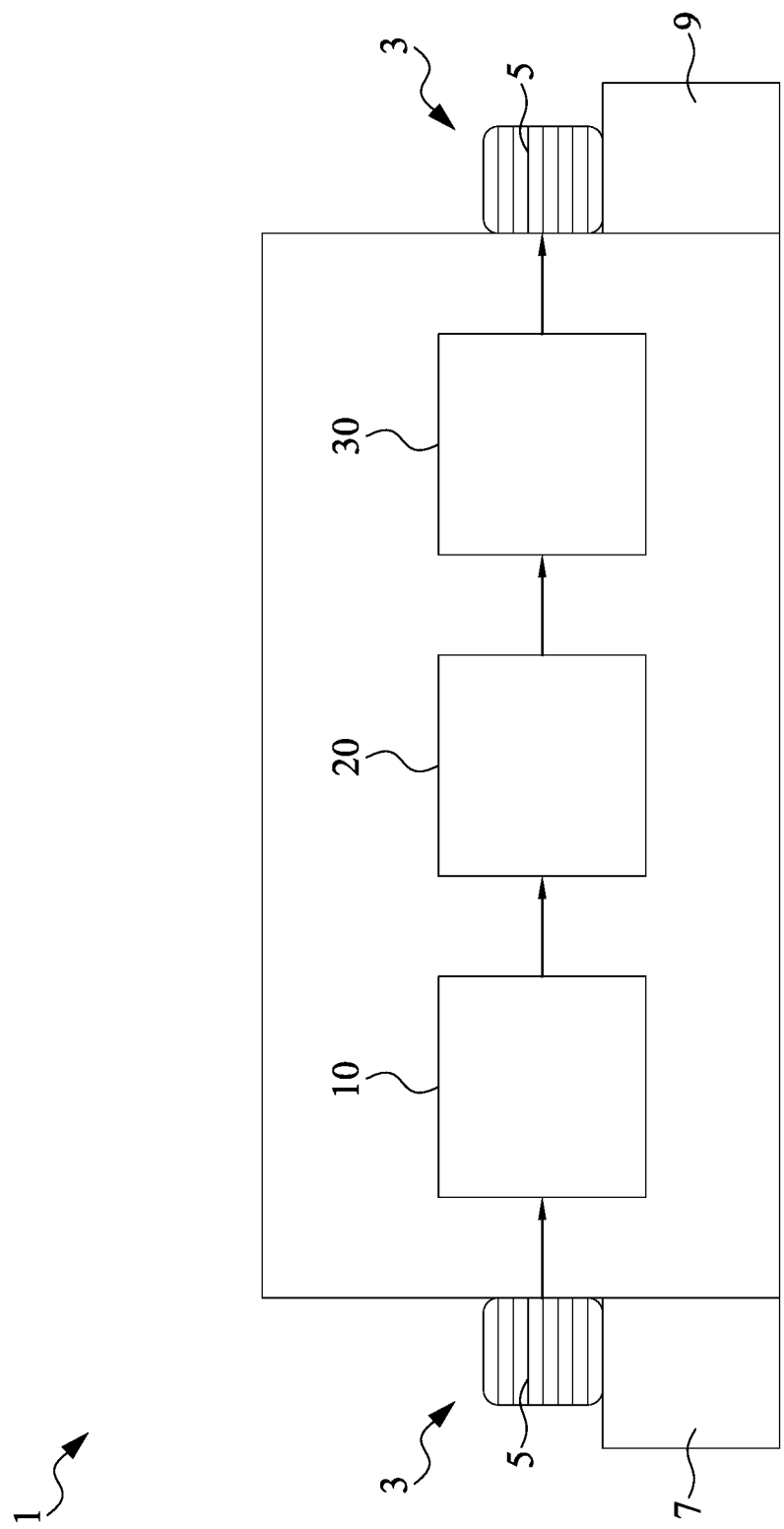
FIG. 1 is a schematic diagram of a processing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Semiconductor device technology has progressed from Large Scale Integration (LSI) through Very Large Scale Integration (VLSI) to the present Ultra Large Scale Integration (ULSI). The fabrication process keeps progressing as the IC layout design develops. Size of semiconductor devices decreases as the IC scales down. Line width of IC interconnects scales down from sub-micro to deep sub-micro, which in turn results in an increasing challenge on IC fabrication. For example, in IC fabrication process, patterns of the IC structure are formed on a surface of a wafer by using photolithography techniques. As the pattern line width decreases, the difficulty of photolithography processes increases.

In the photolithography process of IC fabrication, patterns on the photomask are transferred onto the semiconductor wafer by exposure and developing process. During the exposure process, the light beam may be precisely focused on the wafer surface, so that the patterns can be accurately formed on the silicon wafer. Therefore, various focusing mechanisms are employed in the photolithography process of IC fabrication. It is understood that multiple exposure processes are respectively performed on different exposure areas of the semiconductor wafer, and each exposure process is accompanied by a focus process, so as to form accurate patterns on various exposure areas of the semiconductor wafer.

The focus process includes tuning position of the semiconductor wafer by using, for example, moving the semiconductor wafer in a translational manner or a rotational manner, such that the wafer surface can be tuned to be parallel with projection lens of the photolithography tool. Moreover, the height of the semiconductor wafer can be appropriately tuned such that the wafer surface can fall in the range of focus of the photolithography tool. During the focus process, focus parameters, such as the tilt angle of wafer with respect to a horizontal plane, and increasing/decreasing in height of wafer, are obtained. Operator in semiconductor fab can determine whether the wafer is parallel with the projection lens of the photolithography tool based on the focus parameters. In semiconductor fabrication, focus parameters of a wafer lot (including plural wafers) are collected and analyzed after the wafers of the wafer lot experience the photolithography process.

However, some defective situations occur during tuning the position of silicon wafer. For example, some residues of foreign particles may be inadvertently located on a backside of the silicon wafer, which in turn forms protrusions on the surface of silicon wafer. The protrusions located within an exposure area are usually smaller than the exposure area, thus creating an uneven topography in the exposure area, which in turn may cause portions of the exposure area being out-of-focus.

It may be challenging to correct the out-of-focus defect resulting from the foreign particles on wafer backside during the photolithography process. The out-of-focus defects are spotted in microscope images after wafers of a wafer lot have undergone the photolithography process. Root causes of the out-of-focus defects can then be analyzed and addressed based on the microscope images. After the root causes of the out-of-focus defects are addressed, a next wafer lot may have no or negligible out-of-focus defects after a next photolithography process is complete, which in turn is helpful for cost reduction in IC fabrication.

In order to prevent the out-of-focus defects discussed above, the present disclosure in various embodiments of the present disclosure provides a cleaning method for a wafer table. The cleaning method cleans the wafer table by using microstructures with particular geometry shapes designed for effectively removing foreign particles on the wafer table, which in turn prevents out-of-focus defects in photolithography process.

FIG. 1 is a schematic diagram of a processing system 1 in accordance with some embodiments of the present disclosure. In some embodiments of the present disclosure, the processing system 1 includes a photoresist coating module 10, a polish module 20, an exposure module 30, and one or more load ports, such as two load ports 7, 9. It can be appreciated that any number of fabrication modules can be disposed in the processing system and is not intended to be limiting.

Load ports 7 and 9 are configured for receiving front-opening-unified pods (FOUPs) 3 accommodating a plurality of semiconductor wafers 5. The processing system 1 has openings corresponding to the respective load ports 7 and 9, which allows for the semiconductor wafers 5 passing through the load ports into the processing system 1. In some embodiments, the FOUP 3 placed on the load port 7 is configured to accommodate semiconductor wafers 5 to be processed, and the FOUP 3 placed on the load port 9 is configured to accommodate semiconductor wafers 5 that have undergone the processes performed in the processing system 1. It can be appreciated that any number of load ports can be disposed in the processing system 1 and is not intended to be limiting. Moreover, locations of the load ports 7 and 9 can vary. For example, the load ports 7 and 9 can be disposed adjacently on a same side of the processing system 1.

In some embodiments, after the semiconductor wafer 5 is loaded into the processing system 1, the semiconductor wafer 5 undergoes processing in the photoresist coating module 10, the polish module 20, and the exposure module 30 in sequence. The semiconductor wafer 5 from the FOUP 3 on the load port 7 undergoes a photolithography coating process in the photoresist coating module, and then is transferred to the polish module 20 to planarize the photoresist. Subsequently, the semiconductor wafer 5 is transferred from the polish module 20 to the exposure module 30, so that an exposure process is performed on the photoresist on the semiconductor wafer 5. Next, the semiconductor wafer 5 is transferred from the exposure module to the FOUP on the load port 9. Afterwards, the wafer is transferred to another semiconductor tool, such as an etching tool or a chemical vapor deposition (CVD) tool. Transfer of the semiconductor wafer 5 can be achieved by using one or more robotic arms within the processing system 1.

In some embodiments, the processing conditions of the photoresist coating module 10, polish module 20, and the exposure module 30 and the operation time of the one or more robotic arms for transferring the semiconductor wafer 5 can be controlled by using a pre-set program in a computer or a microprocessor (not shown in FIG. 1).

Figure 2:
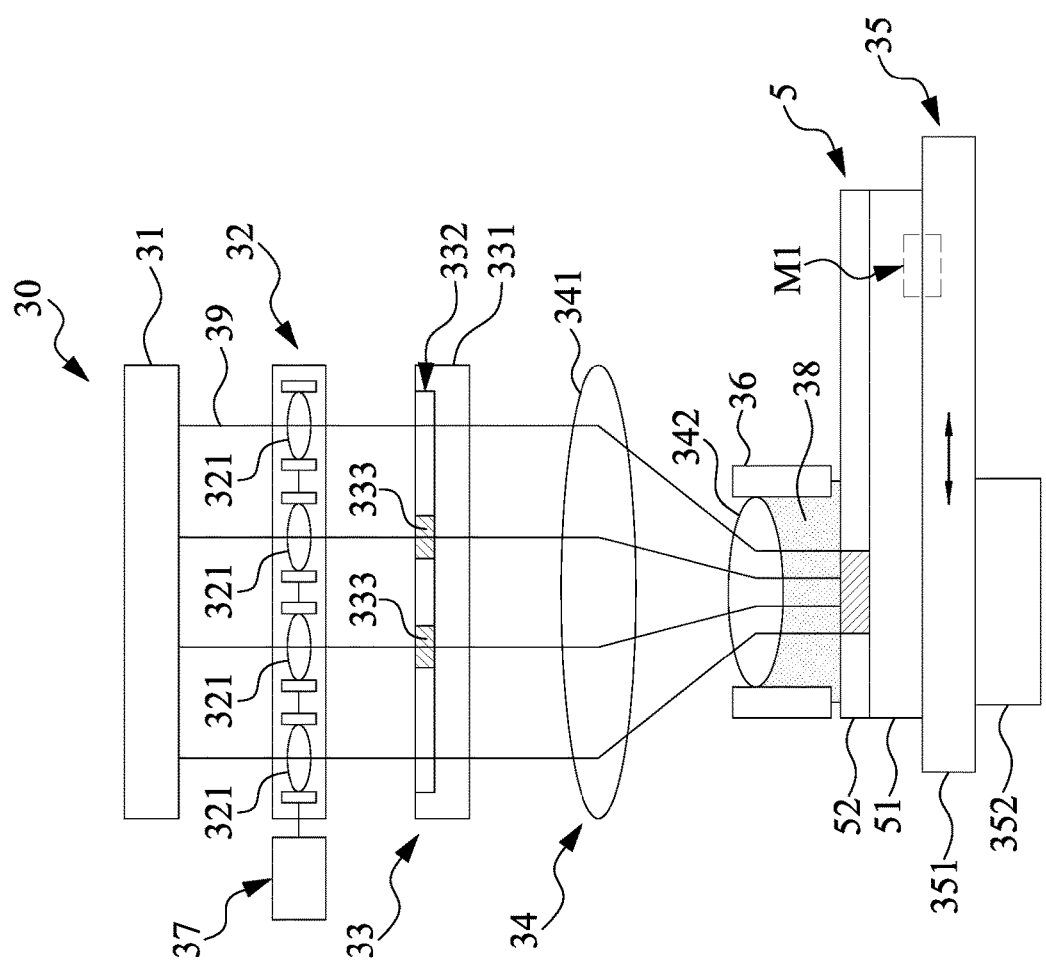
FIG. 2 is a schematic side view of the exposure module in accordance with some embodiments of the disclosure.

Details about the exposure module 30 in accordance with some embodiments of the present disclosure are described below. FIG. 2 is a schematic view of the exposure module 30 in accordance with some embodiments of the disclosure. In some embodiments, the exposure module is used to perform a photolithography process to form a pattern on the photoresist. The exposure module 30 includes a light source 31, an illumination device 32, a photomask 33, an objective lens module 34, a wafer table 35, and a fluid retaining device 36. The light source 31 is located over the illumination device 32. The light source 31 is configured to emit a light beam 39 to the illumination device 32.

In some embodiments, the light source 31 is a mercury lamp having a wavelength of about 436 nm (G-line) or about 365 nm (I-line), a Krypton Fluoride (KrF) excimer laser with wavelength of about 248 nm, an Argon Fluoride (ArF) excimer laser with a wavelength of about 193 nm, a Fluoride ($F_2$) excimer laser with a wavelength of about 157 nm, or other light source having a desired wavelength (e.g., below approximately 100 nm).

It is understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The illumination device 32 is located between the light source 31 and the photomask 33. In some embodiments, the illumination device 32 is a condenser device. The illumination device 32 is configured to condense the light beam 39 to the photomask 33.

The illumination device 32 includes a single lens or a lens assembly having multiple lenses and/or other lens components. For example, the illumination device 32 may include microlens arrays, shadow masks, and/or other structures designed to aid in directing light from the light source 31 onto the photomask 33. In some embodiments, the illumination device 32 includes adjusting lenses 321 arranged in an array. Moreover, the illumination device 32 includes an actuator 37. The actuator 37 is configured to move the adjusting lenses 321 along a vertical direction. Alternatively or additionally, the actuator 37 is configured to move the adjusting lenses 321 along a horizontal direction. Alternatively or additionally, the actuator 37 is configured to rotate the adjusting lenses 321, so that the adjusting lenses 321 can be inclined relative to a horizontal plane.

The photomask 33 is located between the illumination device 32 and the wafer table 35. In some embodiments, the photomask 33 is located between the illumination device 32 and the objective lens module 34. The photomask 33 is configured to partially mask the light beam 39, and form a pattern on the wafer 5. The photomask 33 is replaceable in the exposure module 30 for forming different patterns on different wafers.

The photomask 33 is referred to as a mask or a reticle. The photomask 33 includes a transparent substrate 331 and a patterned absorption layer 332 disposed on the transparent substrate 331. A light beam 39 is partially or completely blocked when hitting an absorption region 333 of the patterned absorption layer 332.

The objective lens module 34 is located between the wafer table 35 and the photomask 33. The objective lens module 34 is configured to condense the light beam 39 to the wafer 5. In some embodiments, the objective lens module 34 includes a single objective lens or a number of objective lens 341 and 342.

The wafer table 35 is located under the photomask 33 and the objective lens module 34. The wafer table 35 is configured to hold the wafer 5. The wafer table 35 includes a wafer chuck 351 and a moving mechanism 352. The wafer chuck 351 is configured to hold the wafer 5. In some embodiments, the wafer chuck 351 is an electrostatic chuck. The moving mechanism 352 is configured to move the wafer chuck 351 in a translational manner, and to rotate the wafer chuck 351. Therefore, the wafer 5 is capable of moving in translational and rotational modes so that the wafer 5 can be aligned with the photomask 33. The fluid retaining device 36 is located between the photomask 33 and the wafer table 35 (or the wafer 5). The fluid retaining device 36 is configured to hold immersion fluid 38. In some embodiments, the wafer 5 includes a substrate 51 and a photoresist layer 52. The photoresist layer 52 is coated on the substrate 51 by a coating process. The photoresist layer 52 is responsive to an exposure process for creating patterns. The photoresist layer 52 includes a positive photoresist or a negative photoresist.

In some embodiments, the substrate 51 is made of silicon, germanium, or other semiconductor materials. In some embodiments, the substrate 51 is made of a compound semiconductor, such as silicon carbide, gallium arsenic, indium arsenide, or indium phosphide. In some embodiments, the substrate 51 is made of an alloy semiconductor such as silicon germanium, silicon germanium carbide, gallium arsenic phosphide, or gallium indium phosphide. In some embodiments, the substrate 51 includes an epitaxial layer. For example, the substrate 51 has an epitaxial layer overlying a bulk semiconductor. In some embodiments, the substrate 51 may be a silicon-on-insulator (SOI) substrate or a germanium-on-insulator (GOI) substrate.

The substrate 51 may include various devices. Examples of devices that are formed on the substrate 51 include transistors such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), and/or other applicable devices. Various processes are performed to form the devices on the substrate 51, such as deposition, etching, implantation, photolithography, annealing, and/or other suitable processes.

Figure 3:
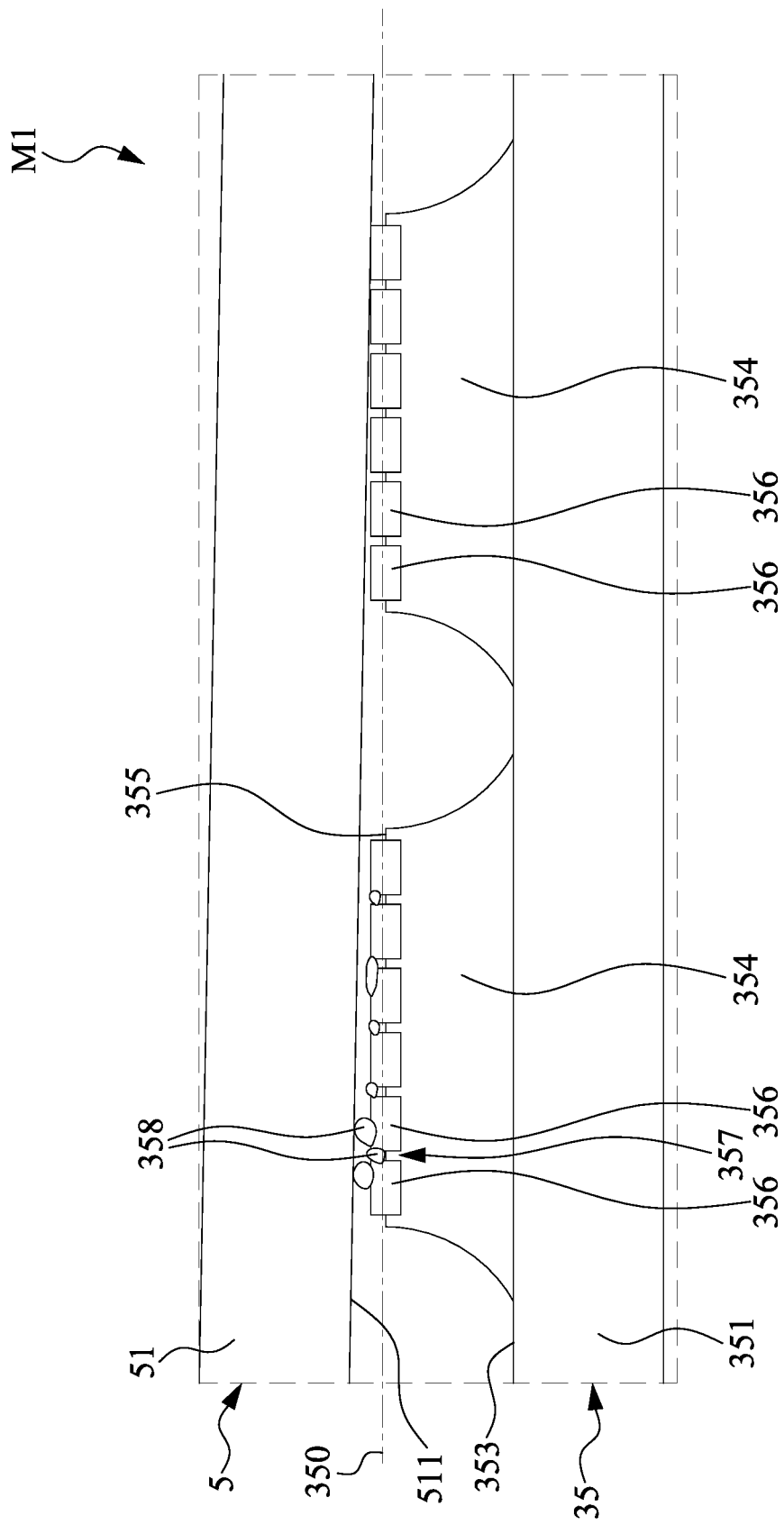
FIG. 3 is a zoomed-in view of a region illustrated in FIG. 2.

FIG. 3 is a zoomed-in view of a region M1 illustrated in FIG. 2. In some embodiments, the wafer table 35 includes a plurality of burls 354 formed on a top surface 353 of the wafer chuck 351. Each burl 354 has a plurality of crystalline structures 356 formed on its top surface 355. The wafer chuck 351 supports the wafer substrate 51 by using top surfaces 355 of burls 354. The top surfaces of burls 354 thus collectively serve as a supporting surface 350 of the wafer table 35. In some embodiments, the crystalline structures 356 include silicon carbide (SiC) crystal, and trenches 357 are formed among the crystalline structures 356. The trenches 357 have a width in a range from 5 μm to about 10 μm.

In some embodiments, as illustrated in FIG. 3, contaminant particles 358 may fall on the supporting surface 350 of the wafer table 35. The contaminant particles 358 may be photoresist residues inadvertently left on the backside surface 511 of the wafer 5, or may be residues of transfer tool left on the backside surface 511 of the wafer 5 during transferring the wafer 5. These contaminant particles 358 may be stuck in the trenches 357 among the crystalline structures 356 or on the surface of the crystalline structures 356. When the wafer 5 is placed on the supporting surface 350 of the wafer table 35, the backside surface 511 cannot be firmly held onto the supporting surface 350 of the wafer table 35, which in turn may degrade the surface flatness in partial regions of the wafer 5.

The present disclosure in some embodiments provides a cleaning scrubber 40 for cleaning the supporting surface of the wafer table 35.

Figure 4:
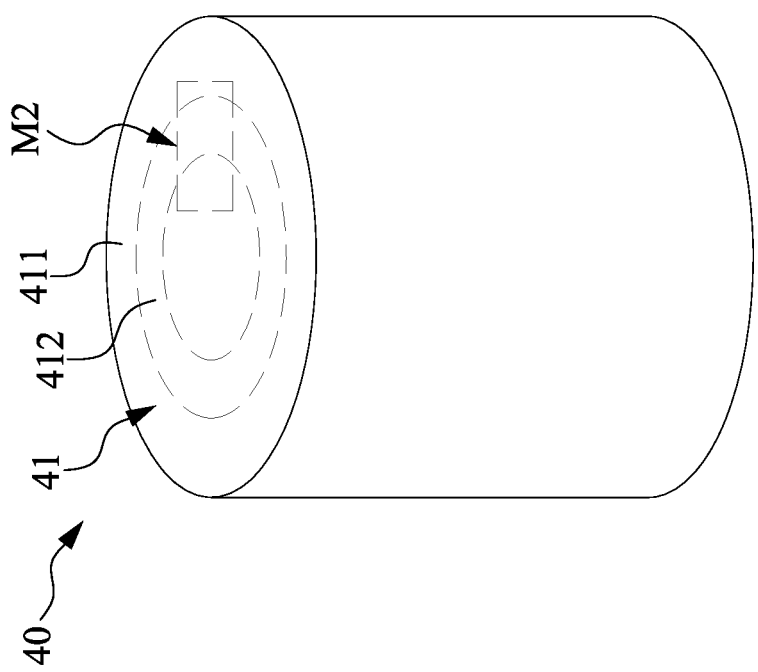
FIG. 4 is a schematic perspective view of the cleaning scrubber in accordance with some embodiments of the present disclosure.

FIG. 4 is a schematic perspective view of the cleaning scrubber 40 in accordance with some embodiments. FIG. 5 is a zoomed-in view of a partial region M2 illustrated in FIG. 4. In some embodiments, the cleaning scrubber 40 is column-shaped, and other shapes are within the scope of the present disclosure. The shape of the cleaning scrubber 40 may be designed depending on requirements. For example, the shape of the cleaning scrubber 40 may be designed such that a human operator can hold it easily. In some embodiments, the cleaning scrubber 40 has a top surface 41. The top surface 41 may be a planar surface or a curved surface.

As illustrated in FIG. 5, microstructures 42 are formed on the top surface 41 of the cleaning scrubber 40. The microstructures 42 are arranged in rows extending along a row direction L. The microstructures 42 are separated by a distance D2 (e.g., distance between apexes 424 of the microstructures 42). Moreover, a row of the microstructures 42 is separated from a next row of the microstructures 42 by a distance, thus forming a particle discharging passage 43 (i.e., the particle discharging passage 43 extending along the row direction L). Moreover, in each row of the microstructures 42, particle discharging passages 43 are formed between adjacent microstructures 42. The particle discharging passages 43 have a width D1. The distance D2 is about four times to about six times the width D1. In some embodiments, the distance D2 between the microstructures 42 is about 330 μm, and the width D1 of the particle discharging passages D1 is about 58 μm. Therefore, the contaminant particles on the supporting surface 350 of the wafer table 35 can be discharged through the particle discharging passages 43, thus resulting in improved cleaning performance.

In some embodiments, the microstructures 42 have substantially equal heights H. In particular, as illustrated in FIG. 5, the microstructures 42 extend outwardly from the top surface 41 of the cleaning scrubber 40 and terminate at the apexes 424. The apexes 424 of the microstructures 42 are vertically separated from the top surface 41 of the cleaning scrubber 40 by the height H.

It is understood that various variations of cleaning scrubber 40 are within the scope of various embodiments of the present disclosure. In some embodiments, as illustrated in FIG. 4, the top surface 41 of the cleaning scrubber 40 includes annular regions 411 and 412 concentrically arranged. The annular regions 411 and 412 each include microstructures 42 formed thereon. The microstructures 42 in the outer annular region 411 (farther from center of top surface 41 of the cleaning scrubber 40) have a height lower than a height of the microstructures 42 in the inner annular region 412 (closer to center of top surface 41 of the cleaning scrubber 40). It is understood that a holding force may concentrate on the central region of the cleaning scrubber 40 when a human operator holds the cleaning scrubber 40. However, because the inner annular region 412 have lower microstructures 42, the supporting surface 350 of the wafer table 35 can be applied with a less concentrated force when it is scrubbed using the cleaning scrubber 40, so as to prevent damaging the supporting surface 350.

In some embodiments, the microstructures 42 are tapered and thus have a width gradually decreasing as a distance from the top surface 41 increases. Specifically, as illustrated in FIG. 6, the microstructure 42 has triangular side surfaces 422 each having a first width D3 at its base 421 and a second width D4 approximately at its apex 424. The first width D3 is greater than the second width D4. In some embodiments, the first width D3 is about 350 μm, and the second width D4 is about 0 μm or slightly greater than 0 μm. In some embodiments, the second width D4 is less than the width of the trench 357 between crystalline structures 356.

In some embodiments, the side surface 422 of the microstructure 42 has a symmetric profile. For example, the side surface 422 of the microstructure 42 is an isosceles triangle having a base angle A1 (i.e., angle between triangle leg 423 and triangle base 421) in a range from about 20 degrees to about 70 degrees. In other embodiments, the side surface 422 of the microstructure 42 has an asymmetric profile. In some embodiments, as illustrated in FIG. 7, the bottom surface 420 of the microstructure 42 is a triangle.

In some embodiments, the microstructures 42 have a hardness comparable to or greater than a hardness of the contaminant particles 358, which in turn increases durability of the cleaning scrubber 40. In some embodiments, the contaminant particles 358 are titanium nitride (TiN) particles having a Vickers-hardness about 2000. In order to effectively remove the contaminant particles, the microstructures 42 have a Vickers-hardness in a range from about 1200 to about 10000. In some embodiments, the microstructures 42 have a Vickers-hardness in a range from about 1500 to about 3500.

The microstructures 42 can be made of any materials having suitable hardness. For example, the microstructures 42 are made of zirconium oxide ($ZrO_2$) having a Vickers-hardness about 1200, silicon nitride ($Si_3N_4$) having a Vickers-hardness from about 1500 to about 1600, aluminum nitride (AlN) having a Vickers-hardness from about 1350 to about 1700, a composite material including aluminum oxide and titanium carbide ($Al_2O_3$—TiC) having a Vickers-hardness about 2100, silicon carbide (SiC) having a Vickers-hardness about 2500, diamond having a Vickers-hardness about 10000, combinations thereof, or the like.

It is understood that the geometry shape and size of microstructures 42 are merely examples and are not intended to be limiting. Microstructures having other shapes and/or sizes can be formed on the cleaning scrubber 40 for cleaning the wafer table. Following are example variations of microstructures 42.

Figure 8:
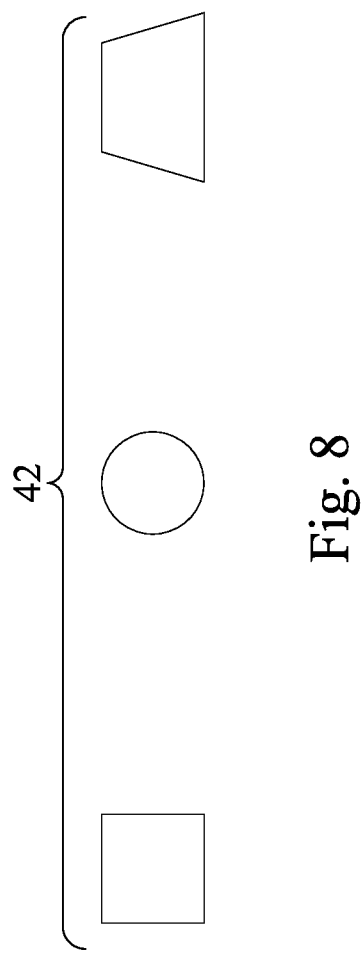
FIG. 8 is a schematic bottom view of microstructures in accordance with some embodiments of the present disclosure.

FIG. 8 is a schematic bottom view of microstructures 42 in accordance some embodiments of the present disclosure. In some embodiments, the bottom surface of the microstructures 42 may be rectangular, circular, trapezoidal, polygonal, or combinations thereof. In some embodiments, microstructures 42 with different bottom surface shapes are arranged side-by-side on the top surface of the cleaning scrubber 40 (FIG. 4). The microstructures 42 having different bottom surface shapes may have substantially the same height (i.e., vertical distance from apexes of microstructures 42 to the top surface 41 of the cleaning scrubber 40).

Figure 9:
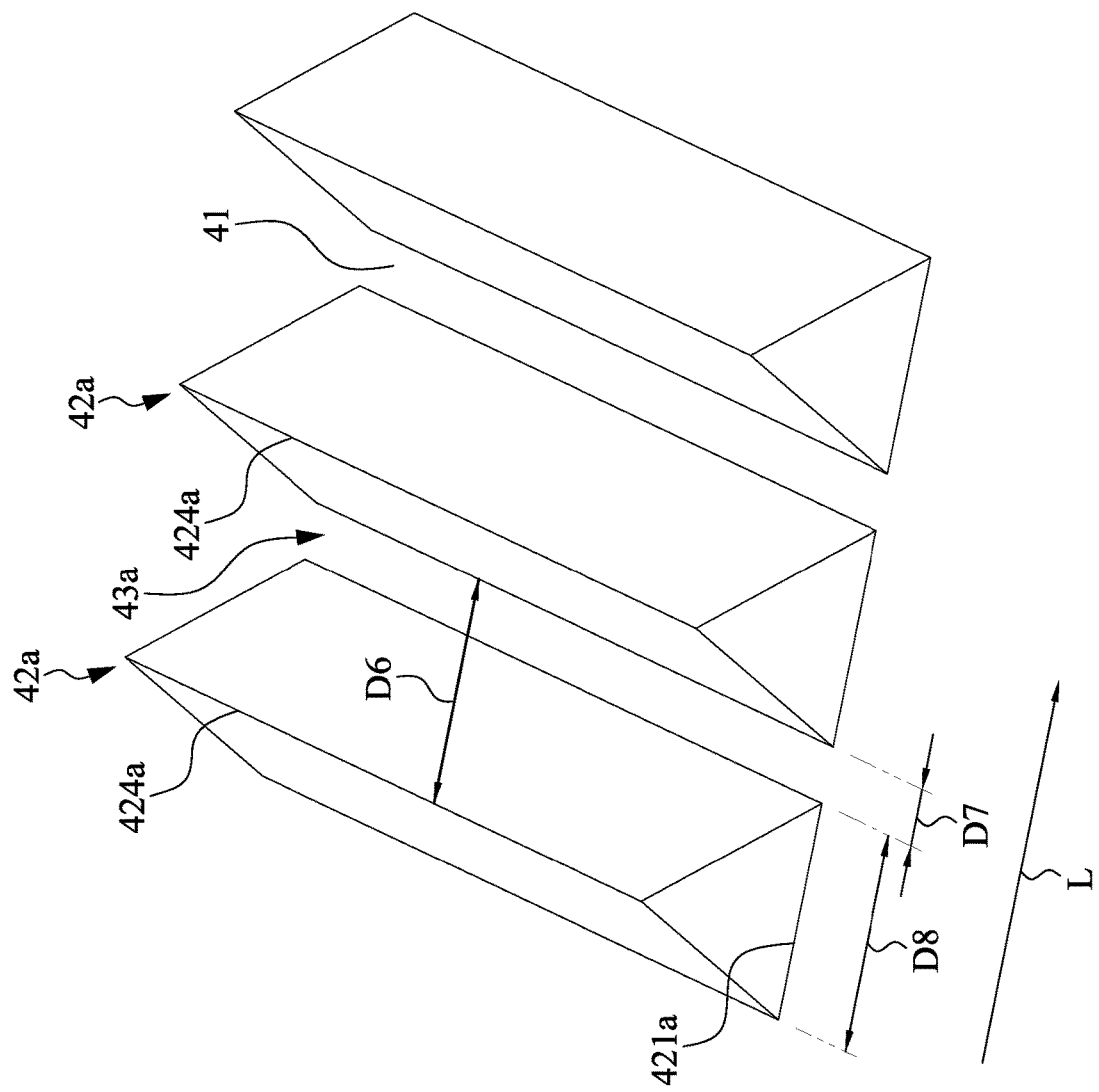
FIG. 9 is a schematic perspective view of microstructures in accordance with some embodiments of the present disclosure.

FIG. 9 is a schematic perspective view of microstructures 42a in accordance with some embodiments of the present disclosure. In some embodiments, the microstructures 42a are triangular prisms extending parallel to each other and arranged along the row direction L. The microstructures 42a have a width decreasing as a distance from the top surface 41 of the cleaning scrubber 40 increases. Adjacent microstructures 42a are separated by a distance D6 (e.g., distance between apexes 424a of the microstructures 42a) along the row direction L, thus forming a particle discharging passage 43a between the adjacent microstructures 42a. The particle discharging passage 43a has a width D7. The microstructure 42a has a width D8 at its bottom side 421a. The distance D6 is about four times to about six times the width D7. In some embodiments, the distance D6 is about 54 μm, the width D7 is about 8.3 μm, and the width D8 is about 52 μm.

Figure 10:
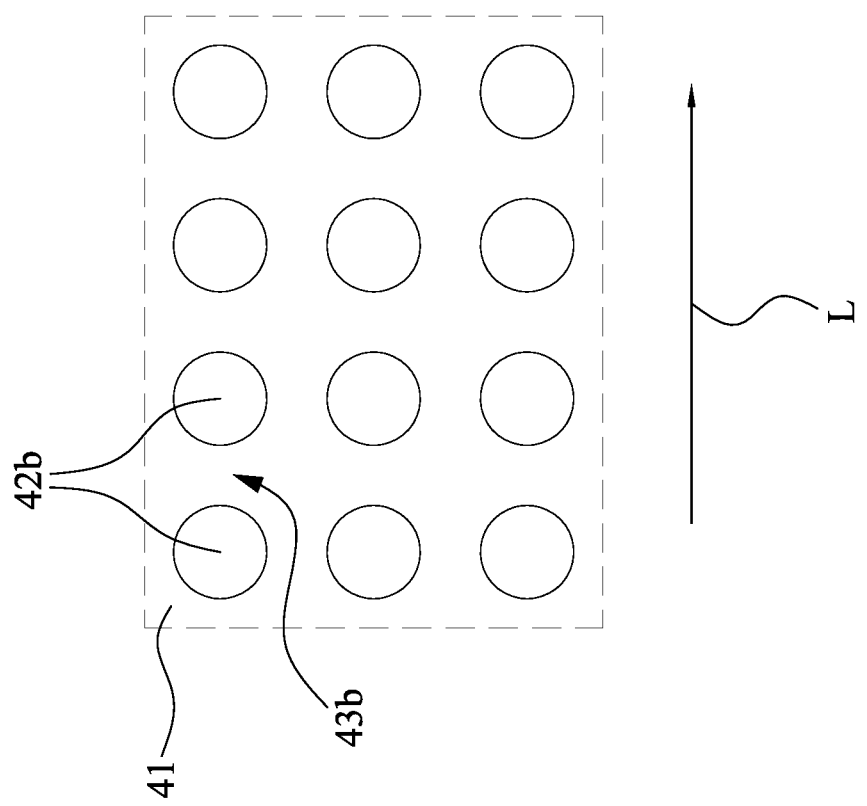
FIG. 10 is a schematic top view of microstructures in accordance with some embodiments of the present disclosure.

FIG. 10 is a schematic top view of microstructures 42b in accordance with some embodiments of the present disclosure. In some embodiments, the microstructures 42b have a circular top-view shape or an elliptic top-view profile. In some embodiments, the microstructures 42b are arranged in rows extending along the row direction L, and thus the microstructures 42b can be arranged in a matrix of rows and columns. In some embodiments, adjacent microstructures 42b are spaced apart from each other to form particle discharging passages 43b, and thus the microstructures 42b are not immediately adjacent to each other.

Figure 11:
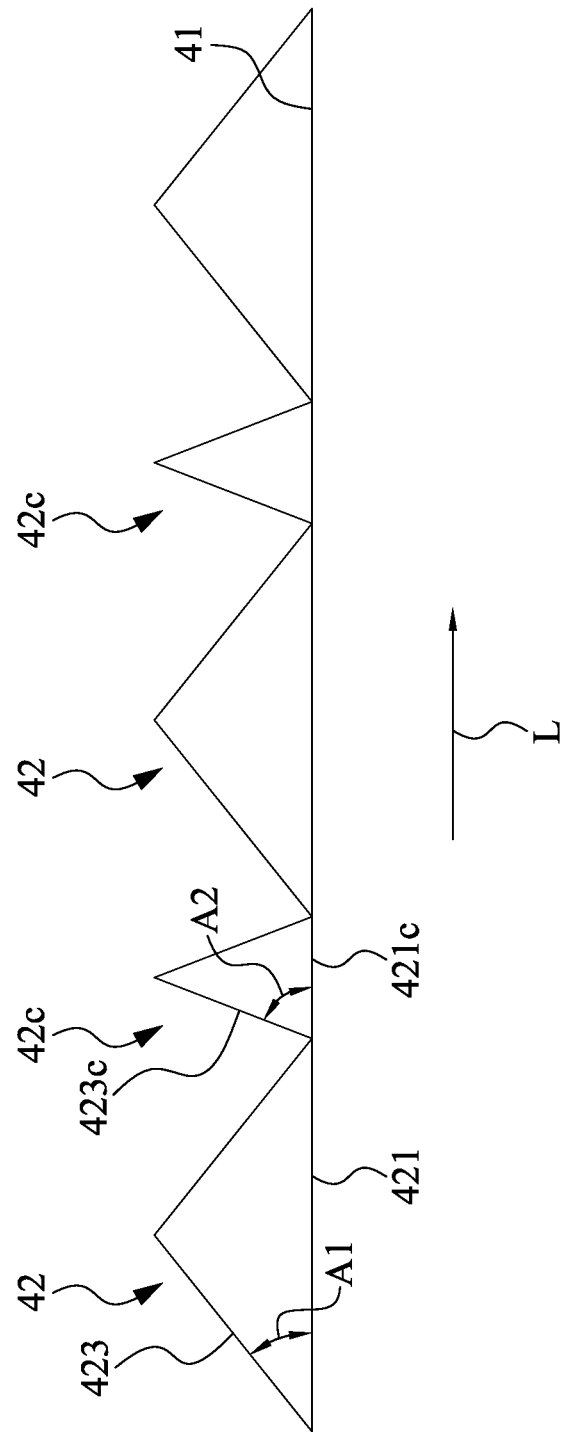
FIG. 11 is a schematic cross-sectional view of microstructures in accordance with some embodiments of the present disclosure.

FIG. 11 is a schematic cross-sectional view of microstructures 42, 42c in accordance with some embodiments of the present disclosure. In some embodiments, the microstructures 42, 42c having different base angles are arranged in an alternating manner, so as to provide different cleaning results. For example, as illustrated in FIG. 11, the microstructures 42 and 42c are alternately arranged along the row direction L. The base angle A1 between the triangle leg 423 and the triangle base 421 of the microstructure 42 is different from the base angle A2 between the triangle leg 423c and the triangle base 421c. In some embodiments, the base angle A1 is in a range from about 45 degrees to about 70 degrees, and the base angle A2 is in a range from about 20 degrees to about 45 degrees. Therefore, apexes of the microstructures 42 and 42c have different apex angles, which in turn allows for cleaning different crystalline surfaces.

Figure 12:
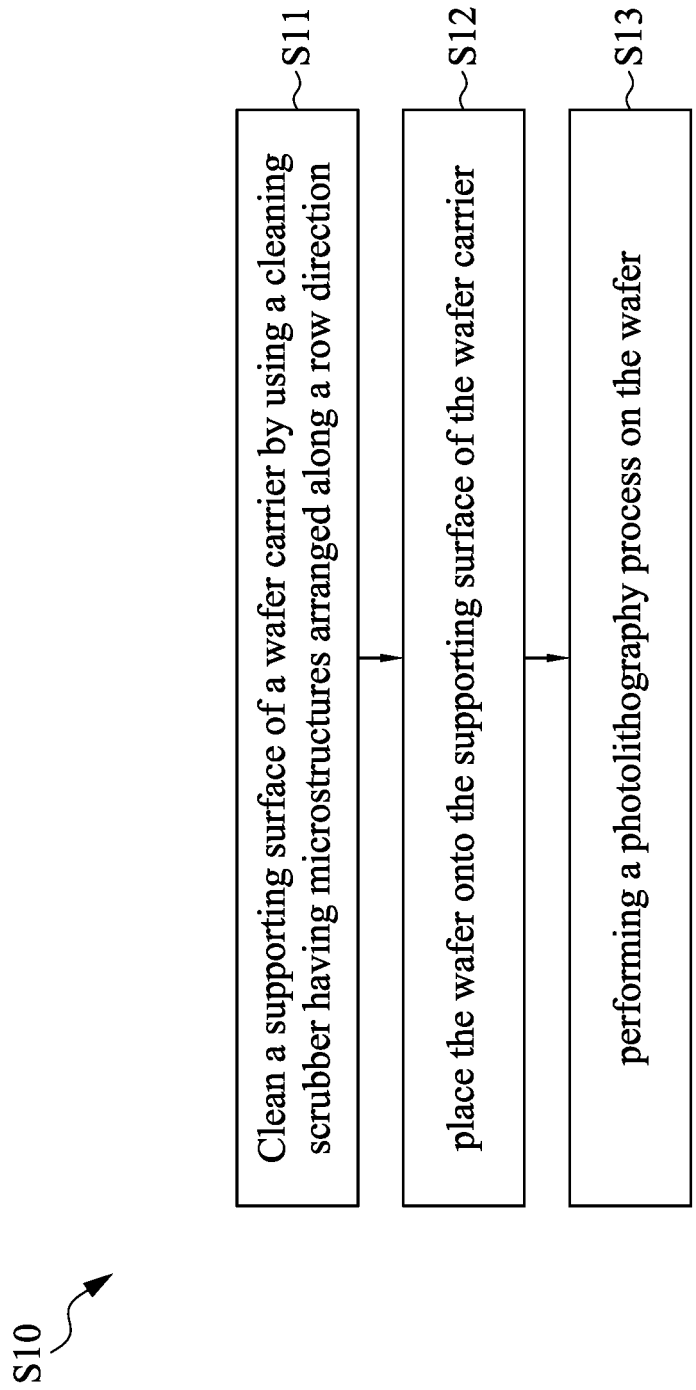
FIG. 12 is a flow chart illustrating a wafer processing method in accordance with some embodiments of the present disclosure.

FIG. 12 is a flow chart illustrating a wafer processing method S10 in accordance with some embodiments of the present disclosure. It is understood that additional operations can be provided before, during, and after the processes shown by FIG. 12, and some of the operations described below can be replaced or eliminated, for additional embodiments of the method. The order of the operations/processes may be interchangeable. Materials, arrangement and size discussed above are applicable in following description, and thus are not repeated for the sake of brevity.

Figure 13:
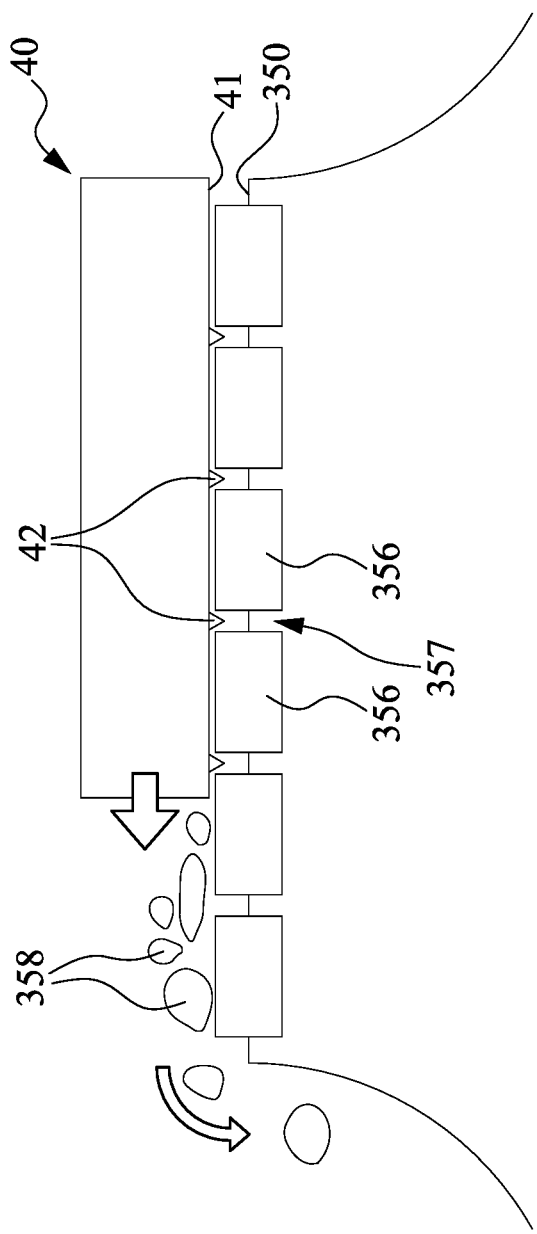
FIG. 13 is a schematic side view of an intermediate stage of the wafer processing method in accordance with some embodiments of the present disclosure.

In operation S11 of the method S10, the cleaning scrubber 40 having microstructures (e.g., microstructures 42) arranged along the row direction is used to clean the supporting surface 350 of the wafer table 35. In some embodiments, the operation S11 is manually performed after a previous wafer lot has undergone a photolithography process and then been removed from the wafer table 35. During the cleaning operation, the top surface 41 of the cleaning scrubber 40 faces the supporting surface 350 of the wafer table 35, such that the microstructures 42 are in contact with the supporting surface 350 of the wafer table 35. In some embodiments, as illustrated in FIG. 13, because the microstructures 42 can extend into the trenches 357 when the cleaning scrubber 40 comes in contact with the wafer table 35, the contaminant particles 358 can be effectively removed from the supporting surface 350. Therefore, after the cleaning operation is complete, the trenches 357 are free of residues of the contaminant particles 358.

Figure 14:
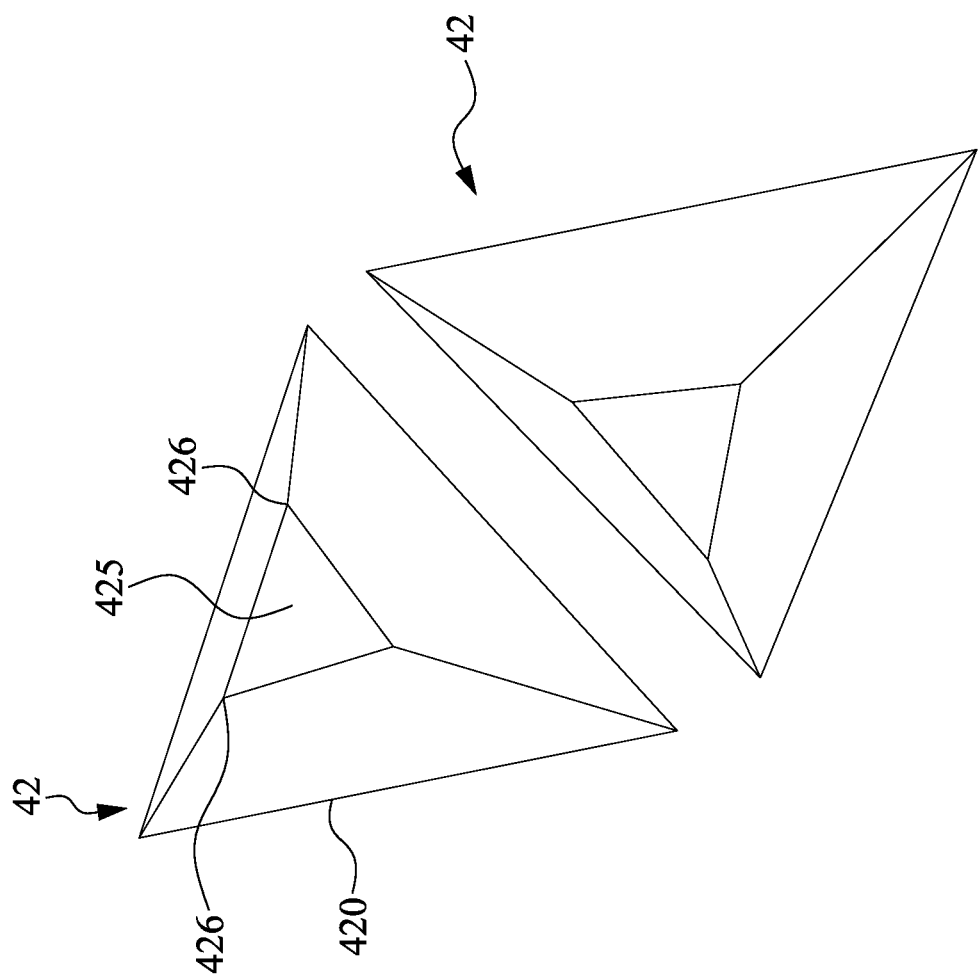
FIG. 14 is a schematic perspective view of microstructures after successively performing the cleaning operation in accordance with some embodiments of the present disclosure.

In some embodiments, as illustrated in FIG. 14, the microstructures 42 may be worn out after successively performing the operation S11 for a particular duration, thus forming flattened top surfaces 425 on the microstructures 42. Because the microstructures 42 still have protruding or sharp corners 426 on edges of the flattened top surfaces 425, the cleaning scrubber 40 can still effectively clean the supporting surface 350 of the wafer table 35 and remove the contaminant particles in the trenches 357. Based on an experiment result, as long as the microstructures 42 are not worn down to the bottom surface 420 of the microstructures 42, the cleaning performance of the microstructures 42 to the supporting surface 350 of the wafer table 35 keeps better than that of marble having irregular shape.

In operation S12 of the method S10, the wafer 5 is placed onto the supporting surface 350 of the wafer table 35. In some embodiments, because the supporting surface 350 of the wafer table 35 has been cleaned up, no contaminant particle remains on the supporting surface 350 of the wafer table 35. Thus, the wafer 5 can be horizontally placed on the supporting surface 350 of the wafer table 35.

In operation S13 of the method S10, a photolithography process is performed on the wafer 5. In some embodiments, as illustrated in FIG. 2, in the photolithography process (e.g., exposure process), the light source 31 emits a light beam 39 to the illumination device 32, the illumination device 32 then condense the light beam 39 to the photomask 33. The light beam 39 is partially blocked by the photomask 33, thus forming a patterned light beam. The patterned light beam 39 then passes through the objective lens module 34 to the wafer 5, so as to irradiate the photoresist layer 52 on the wafer 5. Afterwards, the wafer is transferred to another semiconductor tool, such as an etching tool or a chemical vapor deposition (CVD) tool. Transfer of the semiconductor wafer 5 can be achieved by using one or more robotic arms within the processing system 1.

In accordance with some embodiments of the present disclosure, the cleaning scrubber cleans the wafer table by using microstructures with particular geometry designed for effectively removing foreign particles on the wafer table. Because the microstructures of the cleaning scrubber can extend into trenches in the wafer table when the cleaning scrubber comes in contact with the wafer table, the foreign particles (i.e., contaminant particles) can be effectively removed from the wafer table. Therefore, when a photolithography process (e.g., exposure process) is performed, the wafer can be horizontally placed on the wafer table, which in turn improves yield results. Moreover, because the cleaning scrubber has an improved cleaning ability, maintenance time for the wafer table and hence the exposure tool down time can be reduced, which in turn can decrease the manufacture cost.

In some embodiments, a method includes performing a cleaning operation on a supporting surface of a wafer table by using a cleaning scrubber having a plurality of microstructures, the plurality of microstructures being spaced apart from each other and having a tapered width; placing a semiconductor wafer on the supporting surface of the wafer table; and performing a photolithography process on the semiconductor wafer. In some embodiments, the cleaning operation comprises cleaning the supporting surface of the wafer table by using the plurality of microstructures having a tapered cross section. In some embodiments, the cleaning operation comprises cleaning the supporting surface of the wafer table by using first and second microstructures of the plurality of microstructures, and the first and second microstructures have different base angles and are arranged in an alternating manner. In some embodiments, the base angle of the first microstructures is in a range from about 45 degrees to about 70 degrees, and the base angle of the second microstructures is in a range from about 20 degrees to about 45 degrees. In some embodiments, the first and second microstructures have substantially equal heights. In some embodiments, the cleaning operation comprises cleaning the supporting surface of the wafer table by using the plurality of microstructures having a base angle in a range from about 20 degrees to about 70 degrees. In some embodiments, the plurality of microstructures have substantially equal heights. In some embodiments, the cleaning operation comprises cleaning a plurality of trenches in the supporting surface of the wafer table by using the plurality of microstructures, and portions of the plurality of microstructures extend into the trenches to remove contaminant particles from the trenches. In some embodiments, the contaminant particles comprise titanium nitride particles. In some embodiments, the plurality of microstructures are made of a material having a Vickers-hardness greater than about 1200. In some embodiments, the plurality of microstructures are made of a material having a Vickers-hardness not greater than about 10000.

In some embodiments, a method comprises performing a cleaning operation on a supporting surface of a wafer table by using a cleaning scrubber having a plurality of tapered microstructures; placing a semiconductor wafer on the supporting surface of the wafer table; and performing a photolithography process on the semiconductor wafer. In some embodiments, the cleaning operation comprises cleaning the supporting surface of the wafer table by using the plurality of tapered microstructures having a base angle in a range from about 20 degrees to about 70 degrees. In some embodiments, the plurality of tapered microstructures comprise zirconium oxide, silicon nitride, aluminum nitride, silicon carbide, diamond, a composite material including aluminum oxide and titanium carbide, or combinations thereof. In some embodiments, the plurality of tapered microstructures have a Vickers-hardness in a range from about 1200 to about 10000. In some embodiments, the supporting surface of the wafer table is formed from a plurality of silicon carbide burls separated from each other by trenches. In some embodiments, when the cleaning scrubber comes in contact with the silicon carbide burls during the cleaning operation, the plurality of tapered microstructures extend into the trenches.

In some embodiments, a cleaning scrubber comprises a top surface and a plurality of microstructures spaced apart from each other by a distance. The plurality of microstructures are gradually tapered from a first width to a second width in a direction away from the top surface. The second width is less than a width of a plurality of trenches in a supporting surface of a wafer table. In some embodiments, the plurality of microstructures have a tapered cross section. In some embodiments, the plurality of microstructures comprise alternating first and second microstructures, and the first microstructures have a base angle different from a base angle of the second microstructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 performing a photolithography process on a first wafer held on a plurality of burls of a supporting surface of a wafer table;
 moving the first wafer away from the wafer table; and
 cleaning the wafer table by using a cleaning scrubber, wherein the cleaning scrubber comprises a major surface and a plurality of microstructures extending from the major surface, wherein the major surface of the cleaning scrubber comprises an inner annular region and an outer annular region around the inner annular region, wherein first ones of the plurality of microstructures within the outer annular region have a height different from a height of second ones of the plurality of microstructures within the inner annular region, and the plurality of microstructures are gradually tapered from a first width to a second width in a direction away from the major surface, the second width is less than a width of a plurality of trenches in the supporting surface of a wafer table, wherein the plurality of microstructures remain protruding from the major surface during cleaning the wafer table, wherein the wafer table is cleaned by horizontally moving the cleaning scrubber when the cleaning scrubber comes in contact with the wafer table, and the horizontal movement of the cleaning scrubber causes contaminant particles to fall from top surfaces of the burls to a trench between the burls.

2. The method of claim 1, further comprising:
 after cleaning the wafer table, placing a second wafer on the wafer table; and
 performing another photolithography process on the second wafer.

3. The method of claim 1, wherein the plurality of microstructures of the cleaning scrubber comprise alternating first and second microstructures, and the first microstructures have a base angle different from a base angle of the second microstructures.

4. A method comprising:
 performing a cleaning operation on a supporting surface of a wafer table by using a cleaning scrubber having a plurality of tapered microstructures protruding from a surface of the cleaning scrubber, wherein the surface of the cleaning scrubber comprises an inner annular region and an outer annular region around the inner annular region, wherein first ones of the plurality of tapered microstructures within the outer annular region have a height different from a height of second ones of the plurality of tapered microstructures within the inner annular region, wherein the plurality of tapered microstructures keep a tapered shape during performing the cleaning operation, wherein the cleaning operation comprises horizontally moving the cleaning scrubber when the cleaning scrubber comes in contact with the wafer table;
 placing a semiconductor wafer on the supporting surface of the wafer table; and
 performing a photolithography process on the semiconductor wafer.

5. The method of claim 4, wherein the cleaning operation comprises cleaning the supporting surface of the wafer table by using the plurality of tapered microstructures having a base angle in a range from about 20 degrees to about 70 degrees.

6. The method of claim 4, wherein the plurality of tapered microstructures comprise zirconium oxide, silicon nitride, aluminum nitride, silicon carbide, diamond, a composite material including aluminum oxide and titanium carbide, or combinations thereof.

7. The method of claim 4, wherein the plurality of tapered microstructures have a Vickers-hardness in a range from about 1200 to about 10000.

8. The method of claim 4, wherein the supporting surface of the wafer table is formed from a plurality of silicon carbide burls separated from each other by trenches.

9. The method of claim 8, wherein when the cleaning scrubber comes in contact with the silicon carbide burls during the cleaning operation, the plurality of tapered microstructures extend into the trenches.

10. A method comprising:
 performing a cleaning operation on a supporting surface of a wafer table by using a cleaning scrubber having a plurality of microstructures protruding from a surface of the cleaning scrubber, the plurality of microstructures being spaced apart from each other and having a tapered width, wherein the plurality of microstructures remain protruding from a major surface of the cleaning scrubber during performing the cleaning operation, wherein the cleaning operation comprises horizontally moving the cleaning scrubber to push contaminant particles to fall from a top surface of a burl on the supporting surface of the wafer table to a sidewall of the burl, wherein the surface of the cleaning scrubber comprises an inner annular region and an outer annular region around the inner annular region, wherein first ones of the plurality of microstructures within the outer annular region have a height different from a height of second ones of the plurality of microstructures within the inner annular region;

placing a semiconductor wafer on the supporting surface of the wafer table; and performing a photolithography process on the semiconductor wafer.

11. The method of claim 10, wherein the cleaning operation comprises cleaning the supporting surface of the wafer table by using the plurality of microstructures having a base angle in a range from about 20 degrees to about 70 degrees.

12. The method of claim 10, wherein the plurality of microstructures are made of a material having a Vickers-hardness greater than about 1200.

13. The method of claim 10, wherein the plurality of microstructures are made of a material having a Vickers-hardness not greater than about 10000.

14. The method of claim 10, wherein the height of the first ones of the plurality of microstructures within the outer annular region is lower than the height of the second ones of the plurality of microstructures within the inner region.

15. The method of claim 10, wherein the cleaning operation comprises cleaning the supporting surface of the wafer table by using the plurality of microstructures having a tapered cross section.

16. The method of claim 15, wherein the cleaning operation comprises cleaning the supporting surface of the wafer table by using first and second microstructures of the plurality of microstructures, and the first and second microstructures have different base angles and are arranged in an alternating manner.

17. The method of claim 10, wherein the cleaning operation comprises cleaning a plurality of trenches in the supporting surface of the wafer table by using the plurality of microstructures, and portions of the plurality of microstructures extend into the trenches to remove contaminant particles from the trenches.

18. The method of claim 17, wherein the contaminant particles comprise titanium nitride particles.

19. The method of claim 10, wherein the plurality of microstructures remain protruding from the major surface of the cleaning scrubber during horizontally moving the cleaning scrubber to push the contaminant particles to fall from the top surface of the burl to a sidewall of the burl.

20. The method of claim 19, wherein the plurality of microstructures remain a tapered cross section during horizontally moving the cleaning scrubber.

* * * * *